United States Patent
Chou (10) Patent No.: US 8,130,543 B2
(45) Date of Patent: Mar. 6, 2012

(54) METHOD AND APPARATUS FOR INCREASING MEMORY PROGRAMMING EFFICIENCY THROUGH DYNAMIC SWITCHING OF SENSE AMPLIFIERS

(75) Inventor: Tsung Yi Chou, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 265 days.

(21) Appl. No.: 12/541,113

(22) Filed: Aug. 13, 2009

(65) Prior Publication Data

US 2011/0038204 A1 Feb. 17, 2011

(51) Int. Cl.
*G11C 16/04* (2006.01)
(52) U.S. Cl. .............. 365/185.03; 365/189.05
(58) Field of Classification Search ............. 365/185.03, 365/189.05, 189.14
See application file for complete search history.

(56) References Cited

U.S. PATENT DOCUMENTS

| 6,044,022 | A | 3/2000 | Nachumovsky |
| 6,307,807 | B1 | 10/2001 | Sakui et al. |
| 6,763,424 | B2 | 7/2004 | Conley |
| 7,120,051 | B2 | 10/2006 | Gorobets et al. |
| 7,885,137 | B2 * | 2/2011 | Joo .................. 365/230.03 |
| 2003/0117886 | A1 | 6/2003 | Shiga et al. |
| 2009/0303789 | A1 * | 12/2009 | Fernandes ........... 365/185.03 |

* cited by examiner

*Primary Examiner* — Vu Le
(74) *Attorney, Agent, or Firm* — Stout, Uxa, Buyan & Mullins, LLP (57) ABSTRACT

A method and apparatus are described that efficiently program charge-trapping memory cells by dynamically switching sense amplifiers and corresponding drivers depending upon data to be programmed. When a number of sense amplifier/drivers can be operated simultaneously, cells to be programmed to a same level are selected and programmed simultaneously employing up to the number of simultaneously operable sense amplifier/drivers.

7 Claims, 5 Drawing Sheets

METHOD AND APPARATUS FOR INCREASING MEMORY PROGRAMMING EFFICIENCY THROUGH DYNAMIC SWITCHING OF SENSE AMPLIFIERS

BACKGROUND OF THE INVENTION

1. Field of the Invention

The present invention relates generally to semiconductor memories and, more particularly, to methods of programming semiconductor memories.

2. Description of Related Art

Charge-trapping memories, which have been referred to as flash memories, find extensive use in a wide range of electronic devices including cameras, cellular telephones and personal digital assistants as well as modems, laptop computers and the like. Charge-trapping memories are capable of storing relatively large amounts of data in a small space. Data stored in charge-trapping memories maintains its integrity even in the absence of applied power.

A cell of a charge-trapping memory can be programmed by modifying a threshold voltage associated with the cell. Reading data from the cell can be accomplished by applying a reference voltage and detecting a current level. A cell that is programmable to one of two distinguishable threshold levels for storage of one bit of information is commonly called a single-level cell (SLC). When, for example, four or eight distinguishable threshold levels can be supported by the cell, the cell can be capable of storing, respectively, two or four bits of data. A cell that can store more than one bit of data has been referred to as a multi-level cell (MLC).

The time required to program a charge-trapping memory can be relatively large compared to that required simply to read from or write to the memory. In applications involving electronic devices where data is to be stored as rapidly as possible (e.g., in a digital camera), lengthy programming times can act to hamper efficiency of operation of the memory to the detriment of overall device performance.

A need thus exists in the prior art to reduce the programming time in charge-trapping memories.

SUMMARY OF THE INVENTION

The present invention addresses these needs by providing a method of programming a memory device. An implementation of the method herein disclosed comprises receiving a plurality of binary data values, the binary data values corresponding to first and second programming levels. No more than a specified number of the plurality of memory cells is/are simultaneously programmed to the first programming level when at least one of the binary data values corresponds to the first programming level. Another implementation of the method comprises receiving a plurality of data values that correspond to a plurality of programming levels, and simultaneously programming no more than a specified number of a plurality of cells in the memory device to a first of the plurality of programming levels when at least one of the data values corresponds to the first of the plurality of programming levels.

The present invention further provides a memory apparatus comprising a memory array having rows and columns of cells and a data buffer adapted to receive a plurality of data values to be programmed into cells in a selected row of the array. In an embodiment of the apparatus, each of the plurality of data values corresponds to one of a plurality of programming levels. The embodiment can comprise an address decoder connected to receive an address, which corresponds to the selected row and to a plurality of columns in the row that enables cells in the plurality of columns in the selected row for programming. Further, the embodiment comprises a first plurality of sense amplifiers and corresponding drivers. The embodiment also can comprise column control circuitry adapted to receive the plurality of data values from the data buffer and to select a second plurality of the first plurality of sense amplifiers and corresponding drivers according to data values corresponding to one of the plurality of programming levels. The second plurality may comprise no more than a specified number of sense amplifiers and corresponding drivers. The column control circuitry may further be adapted to program memory cells in the selected row and plurality of columns using the second plurality of sense amplifiers and corresponding drivers according to the one of the plurality of programming levels.

While the apparatus and method has or will be described for the sake of grammatical fluidity with functional explanations, it is to be expressly understood that the claims, unless expressly formulated under 35 U.S.C. §112, are not to be construed as necessarily limited in any way by the construction of "means" or "steps" limitations, but are to be accorded the full scope of the meaning and equivalents of the definition provided by the claims under the judicial doctrine of equivalents, and in the case where the claims are expressly formulated under 35 U.S.C. §112 are to be accorded full statutory equivalents under 35 U.S.C. §112.

Any feature or combination of features described herein are included within the scope of the present invention provided that the features included in any such combination are not mutually inconsistent as will be apparent from the context, this specification, and the knowledge of one skilled in the art. In addition, any feature or combination of features may be specifically excluded from any embodiment of the present invention. For purposes of summarizing the present invention, certain aspects, advantages and novel features of the present invention are described. Of course, it is to be understood that not necessarily all such aspects, advantages or features will be embodied in any particular implementation of the present invention. Additional advantages and aspects of the present invention are apparent in the following detailed description and claims that follow.

DETAILED DESCRIPTION OF THE PRESENTLY PREFERRED EMBODIMENTS

Reference will now be made in detail to the presently preferred embodiments of the invention, examples of which are illustrated in the accompanying drawings. Wherever possible, the same or similar reference numbers are used in the drawings and the description to refer to the same or like parts. It should be noted that the drawings are in simplified form and are not presumed, automatically, to be to precise scale in all embodiments. That is, they are intended to be examples of implementations of various aspects of the present invention and, according to certain but not all embodiments, to be to-scale. While, according to certain implementations, the structures depicted in these figures are to be interpreted to be to scale, in other implementations the same structures should not. In certain aspects of the invention, use of the same reference designator numbers in the drawings and the following description is intended to refer to similar or analogous, but not necessarily the same, components and elements. According to other aspects, use of the same reference designator numbers in these drawings and the following description is intended to be interpreted as referring to the same or substantially the same, and/or functionally the same, components and elements. In reference to the disclosure herein, for purposes of convenience and clarity only, directional terms, such as, top, bottom, left, right, up, down, over, above, below, beneath, rear, and front, are used with respect to the accompanying drawings. Such directional terms should not be construed to limit the scope of the invention in any manner.

Although the disclosure herein refers to certain illustrated embodiments, it is to be understood that these embodiments are presented by way of example and not by way of limitation. The intent accompanying this disclosure is to discuss exemplary embodiments with the following detailed description being construed to cover all modifications, alternatives, and equivalents of the embodiments as may fall within the spirit and scope of the invention as defined by the appended claims. It is to be understood and appreciated that the process steps and structures described herein do not cover a complete process flow for the operation of the disclosed structures. The present invention may be practiced in conjunction with various integrated circuit techniques that are conventionally used in the art, and only so much of the commonly practiced process steps are included herein as are necessary to provide an understanding of the present invention. The present invention has applicability in the field of semiconductor devices and processes in general. For illustrative purposes, however, the following description pertains to a memory device and a related method.

Figure 1:
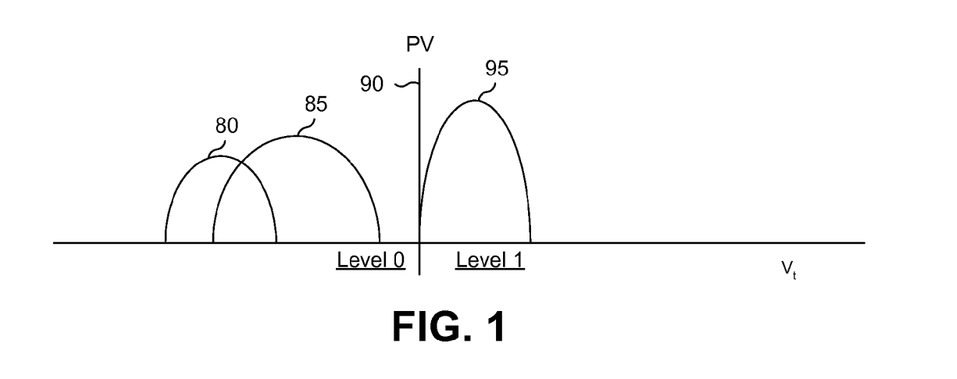
FIG. 1 is a diagram illustrating threshold voltage distributions in a single-level charge-trapping memory cell (CTMC)

A charge-trapping memory may be programmed by applying programming voltages to a memory cell in order to generate electrons having sufficient kinetic energy to reach and to become trapped in a portion of a gate of a transistor where they may influence a threshold voltage of the cell. A single-level charge-trapping memory cell (CTMC) may be programmed to one of two programming levels. FIG. 1 is a diagram representing distributions of a threshold voltage $V_t$ in a single-level CTMC. Distributions 80 and 85, having $V_t$ values less than a program verify level PV 90, may be referred to as level 0; distribution 95, having $V_t$ values greater than the program verify level PV 90 may be referred to as level 1. Distribution 80 typically corresponds to an unprogrammed CTMC. In practice, the PV 90 level may be chosen to exceed a high boundary of, say, one of distribution 80 and distribution 85 by a constant offset value. According to one exemplary embodiment, the PV 90 level exceeds the high boundary of the distribution 80 by about 1.6 V.

A single-level CTMC with a level 0 distribution may be described as "unprogrammed" or "erased," whereas a single-level CTMC having a level 1 distribution may be described as "programmed." Stated another way, a single-level CTMC can be in one of two states: programmed and unprogrammed. It should be clear that programming an erased single-level CTMC to level 0, therefore, requires no action Common practice is to associate a level 0 threshold voltage distribution with a data value of "1," while a data value of "0" may be associated with a level 1 threshold voltage distribution. In practice, programming a single-level CTMC to level 1 may include a step of applying at least one pulse of a set of programming voltages to the cell and then performing a sensing step to determine whether the threshold voltage of the transistor has attained the level of PV. The process may be repeated until the PV programming level is reached. Driver circuitry may be used to provide a capability to apply programming voltages, and a sense amplifier (SA) may be employed to perform the sensing step. According to an exemplary embodiment, each SA has a corresponding driver associated therewith. Each SA and corresponding driver, therefore, may be employed to program a given cell in the array.

Practical restrictions such as program current and noise immunity can limit the number of drivers and SAs allowed to be active at the same time in a single-level CTMC configuration. For example, channel hot electron (CHE) programming may require about 0.5 mA of current per programmed bit. According to one embodiment, about 30 mA of supply current is available in a chip that includes 256 SAs. In this example, it may be practical to operate no more than about 64 SAs and corresponding drives simultaneously. In another embodiment, it may be practical to employ simultaneously, for example, about 128 SAs and corresponding drivers.

Figure 2:
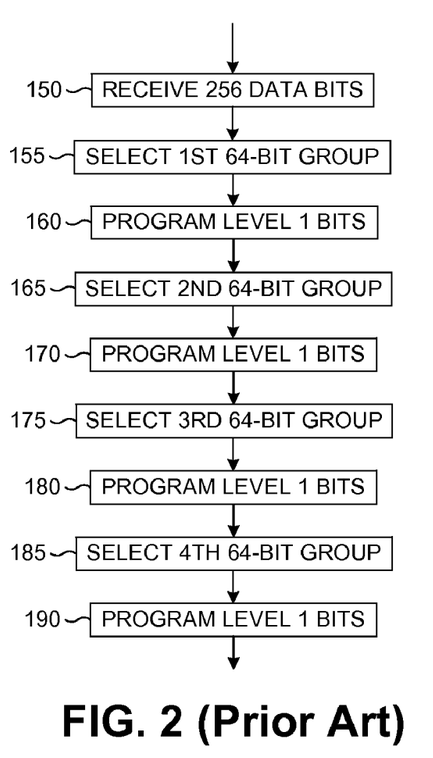
FIG. 2 is a flow diagram describing a prior-art method of programming a single-level CTMC.

FIG. 2 is a flow diagram corresponding to a prior-art method of programming single-level cell (SLC) components of a charge-trapping memory device having, in this example, 256 SAs of which 64 can be active at a given time. A group of 256 binary data values to be programmed is received at step 150 by the memory device. Because of a limitation on the simultaneous operation of SAs, the binary data values are programmed into the SLC in groups of 64. A first group of 64 data values is selected at step 155, and the first group of 64 SLCs is programmed at step 160. The method continues by selecting a second group of 64 binary data values at step 165 and programming a corresponding second group of 64 SLCs at step 170. The process continues in a similar manner, selecting a third group of 64 data values at step 175, programming the third group of 64 SLCs at step 180, and concluding by selecting a fourth group of binary data values at step 185 and programming a fourth group of 64 SLCs at step 190.

Similar considerations apply to programming a multi-level CTMC. As an example, a multi-level CTMC may be programmable to one of four levels as illustrated graphically in FIG. 3. As before, a level 0 threshold voltage distribution 100 or 105 may correspond to an unprogrammed a multi-level CTMC and may be associated with a pair of binary data values, "11." In the four-level example illustrated in FIG. 3, a level 1 distribution 115, which may correspond to a pair of binary data values "01," may have threshold voltage values $V_t$ greater than a first program verify level PV1 110 but less than a second program verify level PV2 120. Similarly, level 2 threshold voltage values 125, which may correspond, for example, to a pair of binary data values "00," may be distributed over a range greater than a second program verify level PV2 120 but less than a third program verify level PV3 130.

Figure 3:
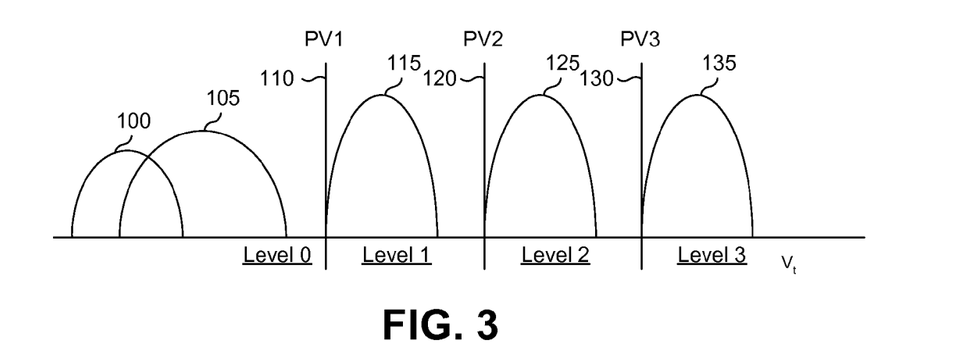
FIG. 3 is a pictorial diagram depicting threshold voltage distributions in a multi-level CTMC.

Level 3 threshold voltage values 135 may be distributed over a range greater than PV3 130 and may correspond to a pair of binary data values "10."

Figure 4:
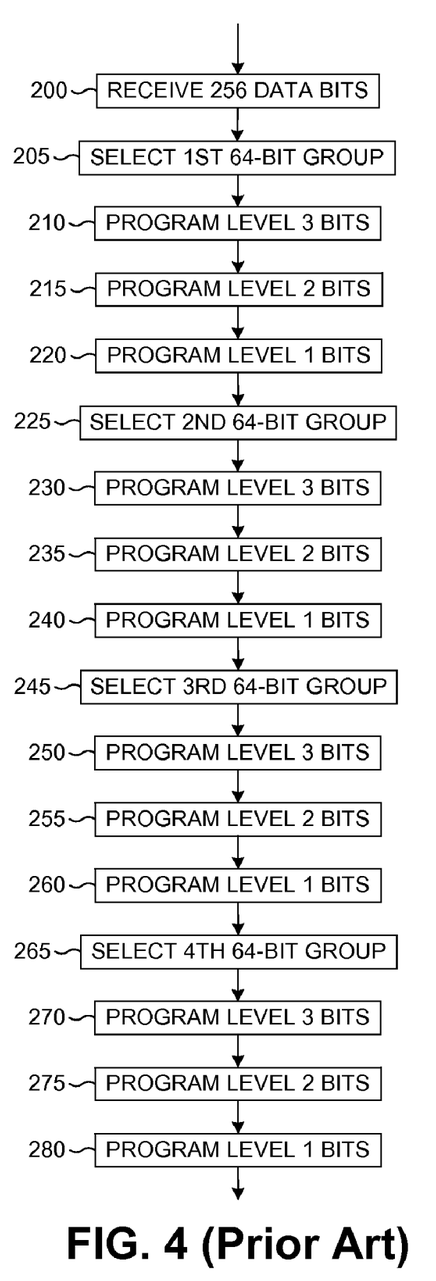
FIG. 4 is a flow diagram illustrating a prior-art method of programming a multi-level CTMC.

FIG. 4 is a flow diagram illustrating an example of a prior-art method of programming a multi-level CTMC. In a manner similar to that described above with reference to FIG. 2, a group of, for example, 256 quaternary (i.e., 4-valued) data values is received at step 200. As already suggested, the data values may be associated with one of four programming levels, namely, level 0, level 1, level 2 and level 3, where level 0 corresponds to a threshold voltage distribution of an unprogrammed or erased multi-level CTMC. Programming data values corresponding to level 0, therefore, require no action. As before, this example assumes that 256 SAs are available and that a maximum of 64 SAs are to be used at any one time. Accordingly, the prior-art method depicted in FIG. 4 selects a first group of 64 data values at step 205. Of the selected group, a portion of the data may have a value of "1" requiring no programming. Another portion of the data may have values of "10," which can be associated with programming corresponding multi-level CTMCs to level 3 at step 210. Another portion of the data may have values of "00," requiring programming of corresponding multi-level CTMCs to level 2 at step 215. A remaining portion of the first group of 64 data values has values of "01," and these are programmed into corresponding multi-level CTMCs as level 1 at step 220. This prior-art method may continued through the remaining steps shown in FIG. 4 by selecting second, third, and fourth groups of data values at respective steps 225, 245, and 265. For each group, the "10," "00" and "01" data may be programmed into corresponding multi-level CTMCs to, respectively, level 3, level 2 and level 1.

It may be noted that, referring to the description of FIG. 2, four programming steps are required to complete the programming of a single-level CTMC using the prior-art method regardless of the data values to be programmed. As an extreme case, even when only one of 64 data values in each group has value "0" the method requires the completion of all four programming steps. A similar observation can be made regarding the prior-art method of programming 4-level multi-level CTMCs summarized in FIG. 4. Even if each group of 64 data values contained exactly one level 3, one level 2, and one level 1 value to be programmed, a total of 12 steps would be required to program four 64-element groups to one of three program levels.

Figure 5:
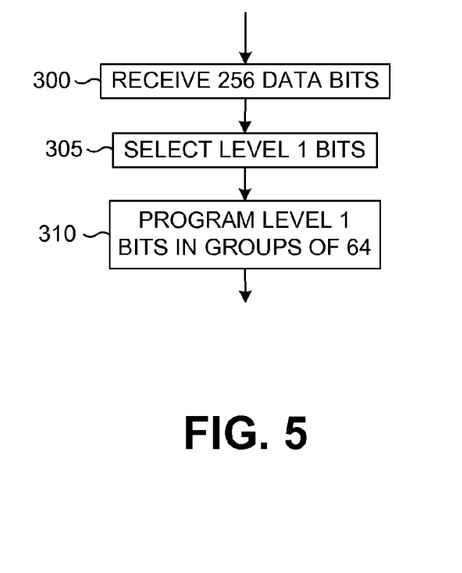
FIG. 5 is a flow diagram summarizing an implementation of a method of programming a single-level CTMC according to the present invention.

FIG. 5 is a flow diagram of an implementation of a method of programming a single-level CTMC according to the present invention. In the examples to follow, for purposes of illustration, and not by way of limitation, 256 SAs are assumed available, no more than 64 of which can be operated simultaneously. The implementation of FIG. 5 receives 256 binary data values at step 300. At step 305, the values corresponding to level 1 (e.g., "0" bits) are selected. At step 310, single-level CTMCs corresponding to the selected values are programmed to level 1 in groups of 64. That is up to 64 SAs are used at the same time to program as many single-level CTMCs to level 1 as possible. Because as many single-level CTMCs as possible are active during each programming cycle, no programming time is wasted because of unused SAs being allocated to single-level CTMCs that need not be programmed.

Figure 6:
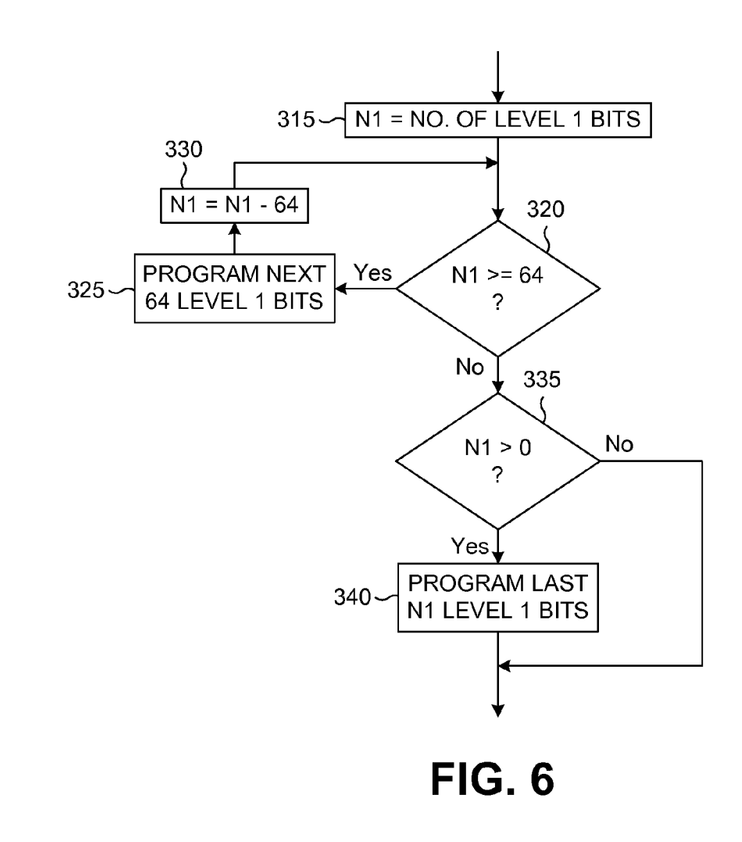
FIG. 6 is a flow diagram elucidating details of a step of the implementation of FIG. 5.

Step 310 of the FIG. 5 implementation is described in more detail in FIG. 6. With the level 1 data values selected at step 305 (FIG. 5), the number of level 1 data values (denoted as N1 in the figure) is counted at step 315. At step 320, if N1 is not less than 64, then 64 of the level 1 data values may be programmed at step 325, thereby making efficient use of the available SAs. The value of N1 is then reduced by 64 at step 330, and a test of the remaining number of level 1 data values is repeated at step 320. Eventually, the number of remaining level 1 data values becomes less than 64, and a result of the test at step 320 directs the implementation to continue at step 335 where the value of N1 is compared to zero. If N1 is zero, then the implementation terminates, there being no remaining level 1 data values to be programmed. Otherwise, if N1 is not zero, then the last remaining N1 level 1 data values are programmed at step 340, this last value of N1 being guaranteed to be less than 64 according to the implementation. After step 340, the method implementation may terminate. Because as many SAs and corresponding drivers as possible are used at each programming step, the amount of time required to complete the programming may be reduced when compared with the time to complete the programming using the prior-art method described above with reference to FIG. 2. More precisely, if the number of level 1 data values in the group of 256 data values is between 193 and 256, inclusive, then no time is saved. If the number is between 129 and 192, inclusive, then only three, not four, programming passes are required to complete programming the group of data values. If the number is between 65 and 128, inclusive, then only two passes are required, and if the number is 64 or less, then only one pass is required. For example, if 150 of the 256 data values are "0" then 64 single-level CTMCs are programmed on the first pass leaving 86 remaining single-level CTMCs to be programmed. An additional 64 single-level CTMCs are programmed on the second pass, leaving 22 single-level CTMCs to be programmed. These remaining 22 single-level CTMCs are programmed on the third, and last, programming pass.

The implementation of the method summarized in FIG. 5 may be extended to operate with multi-level CTMCs. As described in the flow diagram of FIG. 7, 256 data values may be received at step 350, where it is assumed that the data values correspond to one of four programming levels as already described. At step 355, the level 3 data values are identified and programmed in groups of 64. The level 2 data values are, likewise, identified and programmed in groups of 64 at step 360, and, at step 365, the level 1 data values are identified and programmed. As was the case in the single-level CTMC example, no time is wasted by allocating SAs to multi-level CTMCs that are to be programmed to level 0 (i.e., that are to remain unprogrammed).

Figure 7:
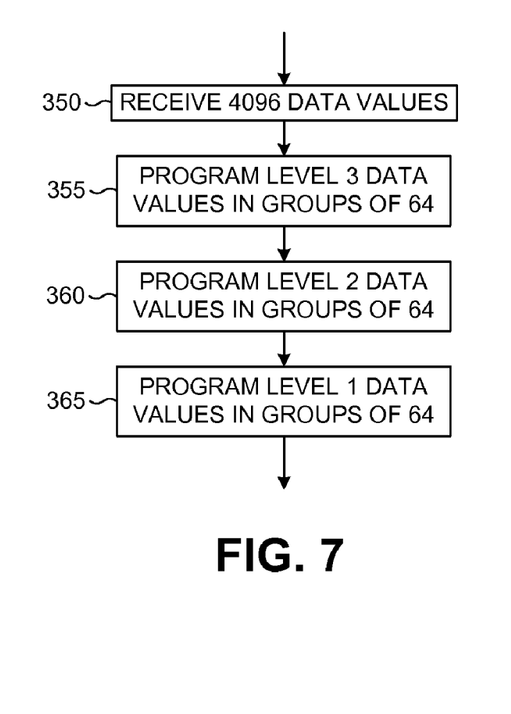
FIG. 7 is a flow diagram summarizing an implementation of a method of programming a multi-level CTMC according to the present invention.
Figure 8:
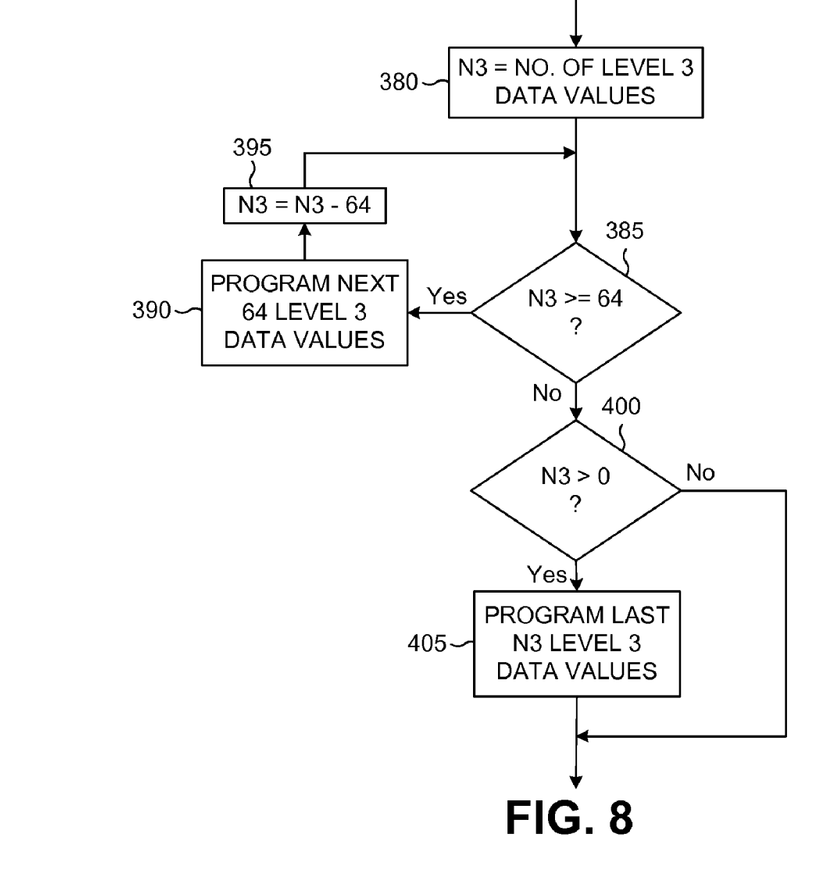
FIG. 8 is a flow diagram describing details of a step of the implementation of FIG. 7.

FIG. 8 is a flow diagram that describes the programming of level 3 data values of step 355 (FIG. 7) in more detail. At step 380, the number of level 3 data values (denoted as N3 in the figure) is counted. At step 385, N3 is compared to 64, and if N3 is at least 64 then 64 level 3 data values are programmed at step 390. N3 is decremented by 64 at step 395, and the new value of N3 is tested at step 385. Eventually, N3 becomes less than or equal to 64, and the implementation continues at step 400 by testing whether any additional level 3 data values remain (i.e., whether N3>0). If so, then the remaining N3 i.e., at least one and no more than a specified value of 64, multi-level CTMCs to be programmed to level 3 are programmed at step 405, and the implementation terminates. If, at step 400, the value of N3 is zero, then the implementation terminates at step 95 without performing any additional programming steps.

A procedure similar to that depicted in FIG. 8 may be repeated for the level 2 and level 1 data values as will be apparent to one skilled in the art. As was the case for single-level CTMCs, the time required to program multi-level CTMCs using the implementation just described may be reduced according to a number of level 0 data values present in the data received at step 350 (FIG. 7). As one example, suppose 60 level 0 data values, 60 level 1 data values, 60 level 2 data values, and 76 level 3 data values are received at step 350. Then one programming pass would be required to complete each of the level 1 and level 2 programming steps (because 60<64). Because 76 level 3 data values need to be programmed, 64 multi-level CTMCs can be programmed on a first pass, and the remaining 12 multi-level CTMCs programmed to level 3 on a last pass. The total number of passes is five rather than 12 as would be expected with the prior-art method of FIG. 4.

Figure 9:
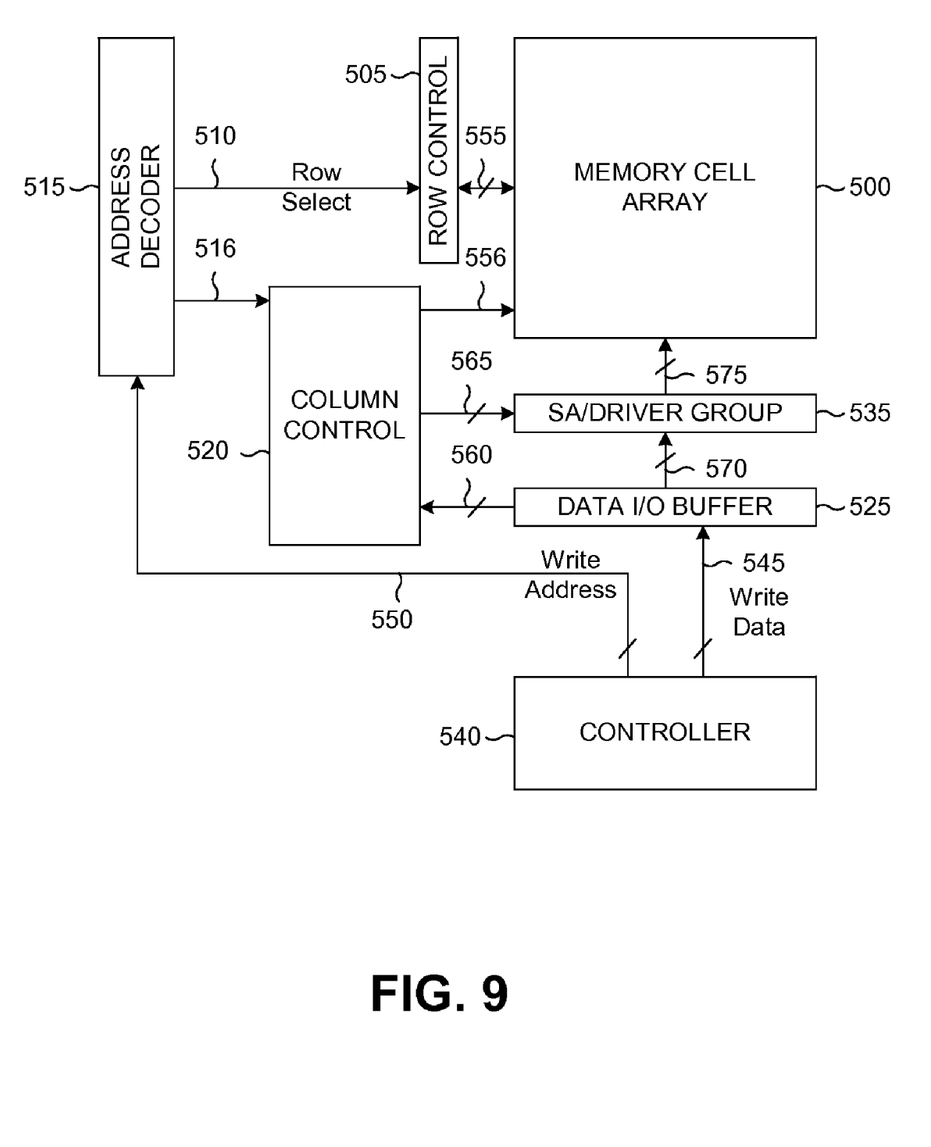
FIG. 9 is a block diagram of an embodiment of an apparatus adapted to program a single-level CTMC and/or a multi-level CTMC array according to the present invention.

FIG. 9 is a block diagram of an embodiment of an apparatus that may be adapted to perform the implementations described above with reference to FIGS. 5-8. The illustrated embodiment comprises a memory cell array 500 of single-level or multi-level CTMCs, and row control circuitry 505 controlled by an address decoder 515. When the memory cell array 500 comprises single-level CTMCs, each CTMC may be programmed to one of two levels corresponding to "erased" and "programmed" states as already described. Multi-level CTMCs may comprise, for example, 4, 8, 16 or more levels, one of which may correspond to an erased state of the CTMC. The remainder of the levels may correspond to program verify levels described above with reference to FIG. 3, which describes a 4-level example. The illustrated embodiment may further comprise column control circuitry 520, a data input/output (I/O) buffer 525 and a group of SAs and corresponding drivers 535. The column control circuitry 520 may receive data from the data (I/O) buffer 525 and may select SAs and corresponding drivers from the SA/driver group 535 in order to program the memory cell array 500. In operation, a controller 540 may receive data from an external source (not shown). The controller 540 may pass the data over a data connection 545 to the data I/O buffer 525. Typically, the controller 540 also receives a write address to which the data is to be written, and the controller 540 may pass this write address to the address decoder 515 over an address connection 550. The address decoder 515 may interpret the write address as several columns within a row in the memory cell array 500. The address decoder 515, further, may pass a row signal to the row control circuitry 505 over a row select connection 510 and may pass a column signal over a column select connection 516 to the column control circuitry 520. The row control and column control circuitry 505 and 520 may send respective coordinated write strobe signals over connections 555 and 556 to the memory cell array 500 to enable the several columns within the addressed row of cells (e.g., single-level or multi-level CTMCs) for writing. That is, the address decoder 515 may turn on a range of columns in a selected row for programming.

Considering first a case of a single-level CTMC array (e.g., the memory cell array 500 is an array of single-level CTMCs), with the FIG. 5 and FIG. 6 process steps shown in parentheses and with a row of the memory cell array 500 selected as described above, binary-valued write data may be received on connection 545 by the data I/O buffer 525 from the controller 540. The column control circuitry 520 may receive the write data (step 300) from the data I/O buffer 525 over a connection 560. The column control circuitry 520 may select (step 305) and count a number of "0" bits, for example, level 1 bits, in the write data, which may comprise, for example, 256 bits. The column control circuitry 520 then may initiate programming of single-level CTMCs in the row of the memory cell array 500 corresponding to the write address 550. The programming may be performed in groups of 64 (step 310) according to the selected level 1 bits. In particular, the column control circuitry 520 may, after determining a number N1, of level 1 bits (step 315), determine whether N1 is at least 64. If so, then the column control circuitry 520 may send an SA/driver select signal over connection 565 to the SA/driver group 535 that activates 64 SAs and corresponding drivers to program a group of 64 single-level CTMCs (step 325). In particular, the selected SAs and drivers may receive the write data over a connection 570 to the data I/O buffer in order to perform the required programming. The column control circuitry 520 may then decrement N1 by 64 (step 330) and repeat the process until a remaining number of level 1 bits is less than 64. The column control circuitry 520 then may (step 335) either terminate the programming or select a last group of SAs and corresponding drivers to program the single-level CTMCs corresponding to the remaining level 1 bits (step 340).

The embodiment of FIG. 9 also may be adapted to perform steps of the implementations of FIGS. 7 and 8 in order to program the memory cell array 500 when the array comprises multi-level (for example, 4-level) CTMCs. In this case, the controller 540 may receive (step 350) from a host (not shown) write data comprising, for example, 256 quaternary data values (i.e., 256 pairs of binary data values) corresponding to level 0, level 1, level 2 and level 3 programming levels as already described. Operations already described above may determine selected columns within a row of the memory cell array 500 according to a write address that is communicated to the address decoder 515 over connection 550. The write data 545 may be passed over connection 545 to the data I/O buffer 525 where it may be held and passed to the column control circuitry 520. The write data may also be made available to the SA/driver group 535 over connection 570.

The column control circuitry 520 may (step 355) initiate programming of level 3 data values in groups of 64. That is, the column control circuitry 520 may select and count a number of level 3 data values in the write data 545, setting the number of level 3 data values to, for example, N3 (step 380). If, according to step 385, the number of level 3 data values, N3, is at least 64, then a next group of 64 SAs and corresponding drivers may be selected according to positions of the level 3 data values in the write data held in the data I/O buffer 525. The selected SAs and drivers, having access to the level 3 data through connection 570, may proceed to program corresponding multi-level CTMCs in the columns of the selected row of the memory cell array 500. The column control circuitry 520 may then reduce a value of N3 by 64 and repeat the process until N3 becomes less than 64 after which any remaining level 3 data values may be programmed in a manner similar to that already described according to steps 400 and 405.

The column control circuitry 520 may repeat the process just described for level 2 and level 1 data values in order to complete programming of the selected row in the memory cell array 500.

In view of the foregoing, it will be understood by those skilled in the art that the methods of the present invention can facilitate operation of charge-trapping memory devices, and in particular of charge-trapping memory devices supporting single-level and/or multi-level operation, in an integrated circuit. The above-described embodiments have been provided by way of example, and the present invention is not limited to these examples. Multiple variations and modification to the disclosed embodiments will occur, to the extent not mutually exclusive, to those skilled in the art upon consideration of the foregoing description. Additionally, other combinations, omissions, substitutions and modifications will be apparent to the skilled artisan in view of the disclosure herein. Accordingly, the present invention is not intended to be limited by the disclosed embodiments, but is to be defined by reference to the appended claims.

What is claimed is:

1. A memory apparatus, comprising:
   a memory array having rows and columns of cells;
   a data buffer adapted to receive a plurality of data values to be programmed into cells in a selected row of the array, wherein each of the plurality of data values corresponds to one of a plurality of programming levels;
   an address decoder connected to receive an address, which corresponds to the selected row and to a plurality of columns in the row and enables cells in the plurality of columns in the selected row for programming;
   a first plurality of sense amplifiers and corresponding drivers adapted to receive the plurality of data values from the data buffer and to program selected memory cells in the array according to the plurality of data values; and
   column control circuitry connected and configured to receive the plurality of data values from the data buffer and to select a second plurality of the first plurality of sense amplifiers and corresponding drivers according to data values corresponding to one of the plurality of programming levels, the second plurality comprising no more than a specified number of sense amplifiers and corresponding drivers, the column control circuitry further being configured to program memory cells in the selected row and plurality of columns using the second plurality of sense amplifiers and corresponding drivers according to the one of the plurality of programming levels.

2. The memory apparatus as set forth in claim 1, wherein the plurality of sense amplifiers and corresponding drivers comprises 256 sense amplifiers and corresponding drivers.

3. The memory apparatus as set forth in claim 1, wherein the second plurality of sense amplifiers and corresponding drivers is 64 or 128 sense amplifiers and corresponding drivers.

4. The memory apparatus as set forth in claim 1, wherein the memory array comprises a plurality of charge-trapping memory cells.

5. The memory apparatus as set forth in claim 4, wherein the charge-trapping memory cells comprise single-level cells.

6. The memory apparatus as set forth in claim 4, wherein the charge-trapping memory cells comprise multi-level cells.

7. The memory apparatus as set forth in claim 6, wherein the multi-level cells are programmable to 4, 8 or 16 levels.

* * * * *